(12) United States Patent
Xiong et al.

(10) Patent No.: US 12,136,464 B2
(45) Date of Patent: Nov. 5, 2024

(54) SOFT DECODING CORRECTABLE PAGE ASSISTED REFERENCE VOLTAGE TRACKING

(71) Applicant: Innogrit Technologies Co., Ltd., Shanghai (CN)

(72) Inventors: Chenrong Xiong, San Jose, CA (US); Jie Chen, Shanghai (CN)

(73) Assignee: Innogrit Technologies Co., Ltd., Shanghai (CN)

( * ) Notice: Subject to any disclaimer, the term of this patent is extended or adjusted under 35 U.S.C. 154(b) by 246 days.

(21) Appl. No.: 17/858,357

(22) Filed: Jul. 6, 2022

(65) Prior Publication Data
US 2024/0013849 A1 Jan. 11, 2024

(51) Int. Cl.
G11C 29/52 (2006.01)
G11C 7/10 (2006.01)
G11C 29/50 (2006.01)

(52) U.S. Cl.
CPC ............ G11C 29/52 (2013.01); G11C 7/1039 (2013.01); G11C 29/50004 (2013.01)

(58) Field of Classification Search
CPC .. G11C 29/52; G11C 7/1039; G11C 29/50004
USPC ......................................................... 365/149
See application file for complete search history.

(56) References Cited

U.S. PATENT DOCUMENTS 7,975,192 B2 * 7/2011 Sommer ............. G11C 11/5642
714/719
11,973,516 B2 * 4/2024 Xiong ................ H03M 13/1125

* cited by examiner

*Primary Examiner* — Huan Hoang
(74) *Attorney, Agent, or Firm* — IPro, PLLC

(57) ABSTRACT

Systems and methods are provided for determining optimal read reference voltages used for reading data in non-volatile storage devices. A method may include reading data stored in a non-volatile storage device using a group of soft read reference voltages, decoding the data and obtaining the number of ones and number of zeros for each of a plurality of zones delineated by the soft read reference voltages, determining that one of the soft read reference voltages is a boundary of a zone in which a comparison result of the number of ones compared to the number of zeros is greater than zero and a boundary of another zone in which a comparison result is less than zero and setting the soft read reference voltage adjusted by an adjustment as an optimal read reference voltage. The adjustment may be obtained based on the two comparison results.

19 Claims, 8 Drawing Sheets

SOFT DECODING CORRECTABLE PAGE ASSISTED REFERENCE VOLTAGE TRACKING

TECHNICAL FIELD

The disclosure herein relates to reference voltages for reading data in non-volatile storage devices, particularly relates to tracking reference voltages for soft decoding correctable pages.

BACKGROUND

The evolution of the modern computing system is driven in-part by the emergence of the Solid State Drives (SSDs) that have demonstrated higher performance of speed and latency over the traditional hard drives. Unlike hard drives that depend on the magnetism to store data, solid state drives use non-volatile memory (e.g., NAND or NOR) devices to achieve data storage. The non-volatile memory devices are a family of integrated circuits that are manufactured by advanced processes and assembly technologies to achieve multiple levels of vertical stacking of storages units into a small footprint of die and package for high capacity of storage.

Data are stored in cells of the non-volatile memory devices. These cells are generally organized in pages, and pages in blocks. A wordline (or word-line) is coupled to the control gates of the all cells of one page and shared by cells in the page. Data are read page by page by applying a read reference voltage (Vref) to the wordline. The read reference voltage is critical for the read performance of the page. The optimal read reference voltage gives the minimum raw Bit Error Rate (BER) value, therefore, provides the best read performance.

The optimal read reference voltage of a page changes as the non-volatile memory device's condition changes. These conditions include life cycle, temperature, data retention time, the amount of read disturbance, the locality of a wordline in a block, and so on. Therefore, tracking the optimal reference voltage is a challenge for non-volatile storage controllers. Conventionally, the number of ones in a page (1s count) is widely used to find the optimal reference voltage because the change of 1s count around the optimal read reference voltage is small. Finding the optimal reference voltage by using 1s count is done one by one for every Vref. To perform this process, normal data traffic has to be stopped to get the corresponding 1s count for each reference voltage. Accordingly, there is a need in the art to find the optimal reference voltage more efficiently.

SUMMARY

The present disclosure provides systems and methods for adaptively estimating the optimal read reference voltage by making use of decoding results from successful soft decoding operations. In an exemplary embodiment, there is provided a method that may comprise reading data stored in a non-volatile storage device using a group of soft read reference voltages, decoding the data read from the non-volatile storage device in a soft decoding process, obtaining a number of ones and a number of zeros for each zone of a plurality of zones delineated by the group of soft read reference voltages, determining that a soft read reference voltage of the group of soft read reference voltages is a first boundary of a first zone in which the number of ones is greater than the number of zeros and a second boundary of a second zone in which the number of ones is less than the number of zeros, and setting the soft read reference voltage adjusted by an adjustment as an optimal read reference voltage for future read operations. The adjustment may be obtained based on a first comparison result of the number of ones compared to the number of zeros in the first zone and a second comparison result of the number of ones compared to the number of zeros in the second zone.

In another exemplary embodiment, there is provided a method that may comprise reading data stored in a non-volatile storage device using a group of soft read reference voltages, decoding the data read from the non-volatile storage device in a soft decoding process, obtaining a number of ones and a number of zeros for each zone of a plurality of zones delineated by the group of soft read reference voltages, determining that the number of ones is equal to the number of zeros in a particular zone of the plurality of zones and setting a voltage value between a first soft read reference voltage and a second soft read reference voltage as an optimal read reference voltage for future read operations. The first soft read reference voltage may be a lower boundary of the particular zone and the second soft read reference voltage may be an upper boundary of the particular zone.

In yet another exemplary embodiment, there is provided a storage system controller. The storage system controller may comprise a non-volatile storage device, an error correction code (ECC) engine comprising a decoder, and a processor. The processor may be configured to: issue a command to read data stored in the non-volatile storage device using a group of soft read reference voltages, obtain a number of ones and a number of zeros for each zone of a plurality of zones delineated by the group of soft read reference voltages after the decoder decodes the data read from the non-volatile storage device in a soft decoding process, determine whether there is one zone in which the number of ones is equal to the number of zeros, if there is a particular zone that the number of ones is equal to the number of zeros, set a voltage value between a first soft read reference voltage and a second soft read reference voltage as an optimal read reference voltage. The first soft read reference voltage may be a lower boundary of the particular zone and the second soft read reference voltage may be an upper boundary of the particular zone. If there is no zone in which the number of ones is equal to the number of zeros, the processor may be further configured to determine that a soft read reference voltage of the group of soft read reference voltages is an upper boundary of a first zone in which the number of ones is greater than the number of zeros and a lower boundary of a second zone in which the number of ones is less than the number of zeros and set the soft read reference voltage adjusted by an adjustment as the optimal read reference voltage. The adjustment may be obtained based on a first comparison result of the number of ones compared to the number of zeros in the first zone and a second comparison result of the number of ones compared to the number of zeros in the second zone.

DETAILED DESCRIPTION

Figure 1:
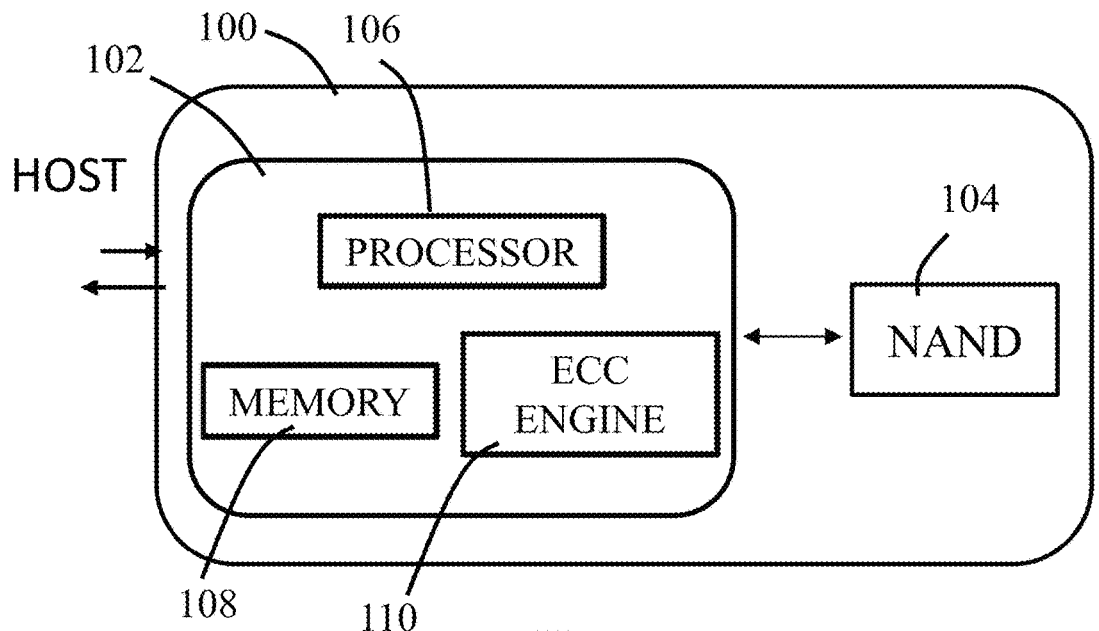
FIG. 1 schematically shows a non-volatile storage system in accordance with an embodiment of the present disclosure.

Specific embodiments according to the present disclosure will now be described in detail with reference to the accompanying figures. Like elements in the various figures are denoted by like reference numerals for consistency.

The present disclosure provides apparatuses, systems and methods for finding the optimal read reference voltage or set of optimal read reference voltages for reading data stored in non-volatile memory (NVM) storage devices that are encoded with an error-correcting code (ECC) (e.g., Turbo, Low-Density Parity-Check (LDPC), and Polar, etc.). FIG. 1 schematically shows a non-volatile storage system 100 in accordance with an embodiment of the present disclosure. The non-volatile storage system 100 may comprise a non-volatile storage controller 102 and a non-volatile storage device 104. The non-volatile storage system 100 may provide data storage and/or access to stored data for a host when it is coupled to the host. The non-volatile storage device 104 may be a non-volatile memory (NVM) based storage device, for example, a NAND device. It should be noted that the non-volatile storage system 100 may comprise a plurality of non-volatile storage devices and the non-volatile storage device 104 may be shown as a representative for the plurality of non-volatile storage devices.

The non-volatile storage controller 102 may comprise a processor 106, a memory 108 and an ECC engine 110. The processor 106 may be a computer processor, such as, but not limited to, a microprocessor or a microcontroller. The memory 108 may be a non-transitory computer-readable storage media, such as, DRAM or SRAM, to store computer executable instructions to be executed by the processor 106. The ECC engine 110 may comprise one or more ECC encoders and also may comprise one or more ECC decoders. The one or more ECC encoders may generate encoded data based on input data to be stored and the encoded data may be stored in the non-volatile storage device 104 in a write (program) operation. The one or more ECC decoders may decode the encoded data retrieved from the non-volatile storage device 104 in read operations and correct errors in the data retrieved from the non-volatile storage device 104.

Data stored in the non-volatile storage device 104 may be read by hard read operations or soft read operations. In hard read operations, a hard decision threshold voltage may be used to determine a bit value out of two adjacent states (e.g., logic one and logic zero). In soft read operations, a group of soft read reference voltages may be used to determine a bit value out of two adjacent states. In addition to bit values, soft read operations may also provide reliability information of the bit values, which may be presented as log-likehood ratio (LLR) values. An LLR may indicate how much more likely a bit in a voltage range may be one logic state (e.g., 0) instead of another logic state (e.g., 1). The soft read operations may be used when hard read operations fail. The ECC engine 100 may comprise at least one decoder configured to perform soft decoding based on the data and reliability information obtained by soft read operations. In various embodiments, soft decoding results of data obtained by soft read operations may help track optimal read reference voltages, which may be used as the hard decision threshold voltages for future hard read operations.

In some embodiments, encoded data may be scrambled before being written to the non-volatile storage device 104. The scrambling process may be a randomization process, which may be used, for example, to try to make number of 1s and number of 0s to be evenly distributed. In such embodiments, data retrieved from the non-volatile storage device 104 may be de-scrambled first and de-scrambled data may be sent to the decoder of the ECC engine for decoding. The decoding result data may be the original data to be stored but the bit values written to the non-volatile storage device 104 may be scrambled. Therefore, in such embodiments, to get the bit values for the bits written to the non-volatile storage device 104, the decoded data may be scrambled using the same scrambling process.

Figure 2:
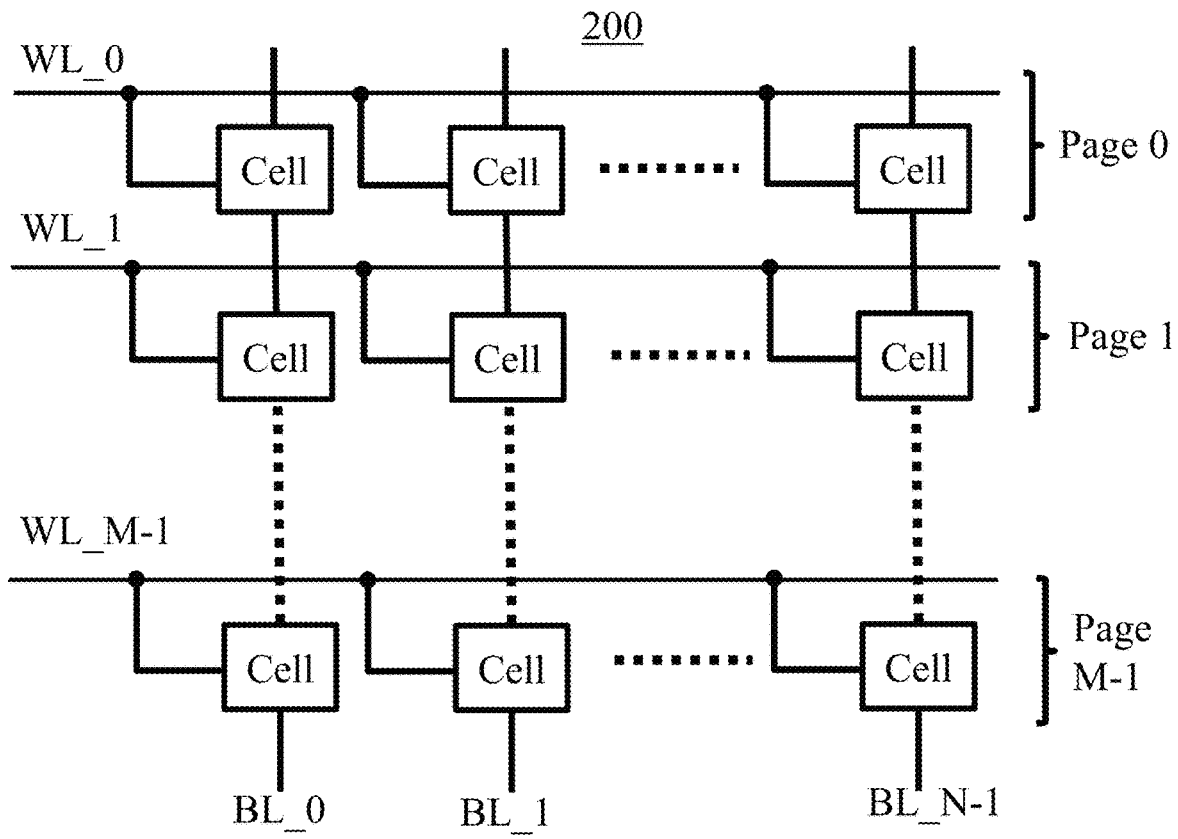
FIG. 2 schematically shows a block of cells in a non-volatile storage device in accordance with an embodiment of the present disclosure.

FIG. 2 schematically shows a block 200 of cells in a non-volatile storage device in accordance with an embodiment of the present disclosure. The non-volatile storage device 104 may comprise one or more dies. Each die may comprise one or more planes and each plane may comprise a plurality of blocks. The block 200 may comprise a plurality of cells organized in a two-dimensional array. The cells in each row may be coupled to one wordline (WL) and referred to as one page (e.g., a physical page). For example, cells of page 0 may have their respective control gates coupled to WL_0, cells of page 1 may have their respective control gates coupled to WL_1, and so on and so forth, until cells of page M-1 may have their respective control gates coupled to WL_M-1. In the column direction, cells may be coupled in series to a bitline (BL), for example, cells in the first column may be chained in series and coupled to BL_0, cells in the second column may be chained in series and coupled to BL_1, and so on and so forth, until cells in the Nth column may be chained in series and coupled to BL_N-1. It should be noted that the physical layout of the cells in a block may be different from the two-dimensional array shown in FIG. 2. But regardless of the physical layout structure, all cells of one physical page share one common wordline.

In one embodiment, the cells in the non-volatile storage device 104 may be a single-level cell (SLC) that may store a one-bit value. In another embodiment, the cells in the non-volatile storage device 104 may be a multi-level cell (MLC) that may store a two-bit value. The two-bit value may be represented as a tuple (LSB, MSB), where LSB is the least significant bit and MSB is the most significant bit. The LSBs stored in a wordline may form the LSB page and the MSBs stored in the wordline may form the MSB page. The LSB page and MSB page for an MLC non-volatile storage device may be referred to as logical pages.

In yet another embodiment, the cells in the non-volatile storage device 104 may be a triple-level cell (TLC) that may store a three-bit value. The three-bit value may be represented as a tuple (LSB, CSB, MSB), where LSB is the least significant bit, CSB is the center significant bit and MSB is the most significant bit. The LSBs stored in a wordline may form the LSB page, CSBs stored in the wordline may form the CSB page and the MSBs stored in the wordline may form the MSB page. The LSB page, CSB page and MSB page for a TLC non-volatile storage device may also be referred to as logical pages. In yet other embodiments, the cells in the non-volatile storage device 104 may store other bit values (e.g., quad-level cell (QLC) for four-bit values), and the cells along one wordline may form more than three logical pages.

The values stored in the cells may be read by measuring the threshold voltages of the cells. The threshold voltage may be the minimal voltage that needs to be applied to the control gate (e.g., a transistor) of a cell to cause the gate to open (e.g., conduct). The read threshold voltage may be indicative of the charge stored in the cell. For cells storing one-bit values (e.g., SLC), each cell may be programmed in one of two states and data stored in the cells of one physical page may be read by applying one hard decision threshold voltage for a hard decision read and a group of read reference voltages to the wordline for a soft read.

For cells storing multi-bit values (e.g., MLC or TLC), each cell may be programmed in one of more than two states (e.g., 4 states for MLC, 8 states for TLC). Different logical pages of these cells may be read by different number of hard decision threshold voltages in hard decision reads and different number of groups of soft read reference voltages in soft reads. For example, the LSB page of MLC cells may need one hard decision threshold voltage for a hard decision read, and one group of soft decision read reference voltages for a soft read. The MSB page of MLC cells may need two hard decision threshold voltages for a hard decision read, and two groups of soft decision read reference voltages for a soft read. Moreover, the LSB page of TLC cells may need one hard decision threshold voltage for a hard decision read, and one group of soft decision read reference voltages for a soft read. The CSB page of TLC cells may need two hard decision threshold voltages for a hard decision read, and two groups of soft decision read reference voltages for a soft read. And the MSB page of TLC cells may need four hard decision threshold voltages for a hard decision read, and four groups of soft decision read reference voltages for a soft read.

Figure 3A:
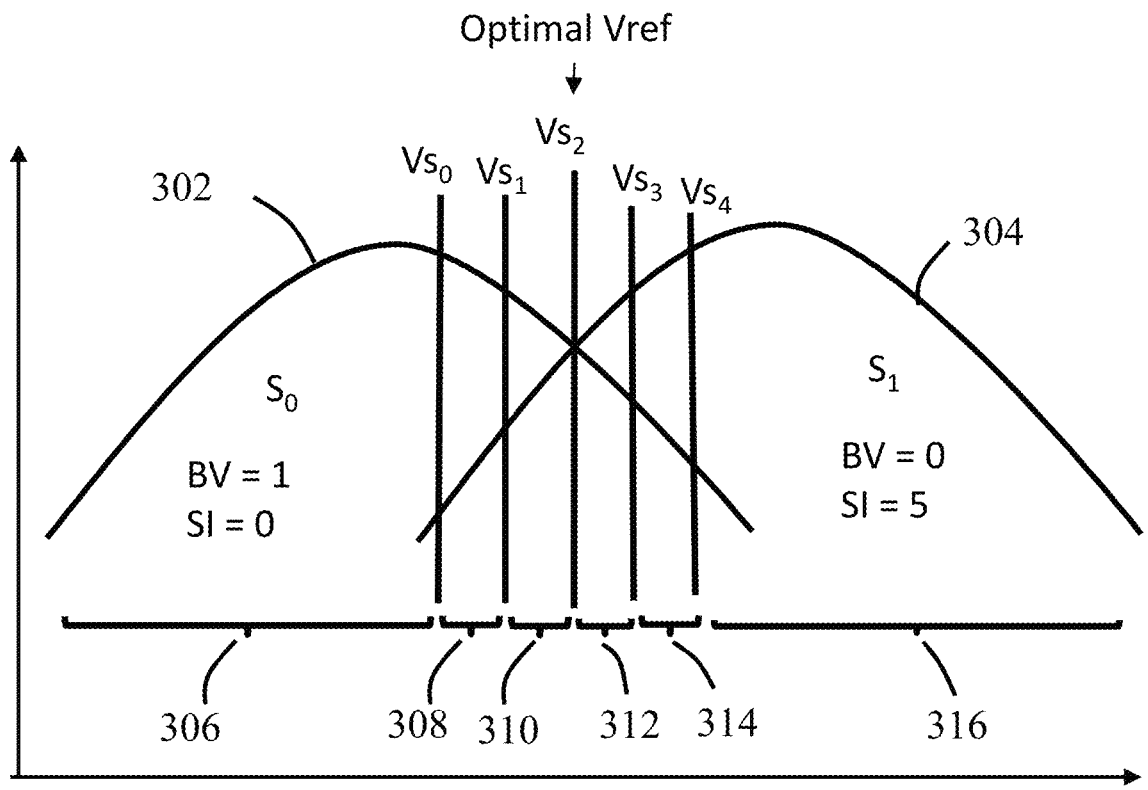
FIG. 3A schematically shows state information of two adjacent states with respect to a group of soft read reference voltages in accordance with an embodiment of the present disclosure.

FIG. 3A schematically shows state information of two adjacent states with respect to a group of soft read reference voltages in accordance with an embodiment of the present disclosure. The horizontal axis in FIG. 3A may be the threshold voltage of storage cells in a SLC storage device. The vertical axis in FIG. 3A may be the probability distribution function of the threshold voltages of storage cells. The curve 302 in FIG. 3A may indicate distribution of cells in a first logic state ($S_0$) with the bit value being logic one (BV=1). The curve 304 in FIG. 3A may indicate distribution of cells in a second logic state ($S_1$) with the bit value being logic zero (BV=0). Data stored in one row of cells may be read in a soft read operation by applying a group of soft read reference voltages to the wordline shared by the cells. The five reference voltages $Vs_0$, $Vs_1$, $Vs_2$, $Vs_3$, and $Vs_4$ may be an example of the group of soft read reference voltages. The state information in FIG. 3A may be collected from the data read in the soft read operation. The first logic state and the second logic state may be two adjacent states distinguished by the group of soft read reference voltages.

As shown in FIG. 3A, the group of soft read reference voltages $Vs_0$, $Vs_1$, $Vs_2$, $Vs_3$, and $Vs_4$ may have a plurality of voltage ranges that divide the two states $S_0$ and $S_1$ into a plurality of zones 306, 308, 310, 312, 314 and 316. Each zone may be assigned a unique number, referred to as a soft information (SI) value. For example, zone 306 may be the voltage range of less than the soft read reference voltage $Vs_0$ and assigned a SI value of 0 (e.g., zone SI(0)), Zone 308 may be the voltage range of from $Vs_0$ to $Vs_1$ and assigned a SI value of 1 (e.g., zone SI(1)), Zone 310 may be the voltage range of from $Vs_1$ to $Vs_2$ and assigned a SI value of 2 (e.g., zone SI(2)), Zone 312 may be the voltage range of from $Vs_2$ to $Vs_3$ and assigned a SI value of 3 (e.g., zone SI(3)), Zone 314 may be the voltage range of from $Vs_3$ to $Vs_4$ and assigned a SI value of 4 (e.g., zone SI(4)), Zone 316 may be the voltage range of greater than $Vs_4$ and assigned a SI of 5 (e.g., zone SI(5)). Each voltage of the group of soft read reference voltages $Vs_0$, $Vs_1$, $Vs_2$, $Vs_3$, and $Vs_4$ may be a boundary between two adjacent SI zones. In some embodiments, each boundary may be inclusive for only one voltage range. For example, Zone 310 may be the voltage range of greater than or equal to $Vs_1$ and less than $Vs_2$; alternatively, Zone 310 may be the voltage range of greater than $Vs_1$ and less than or equal to $Vs_2$. In various embodiments, a boundary may be included in either zones as long as all boundaries for one group of soft read reference voltages may be included the same way.

The curve 302 and curve 304 may overlap. In the overlapped area, the bit value read from a non-volatile storage device (e.g., the non-volatile storage device 104) may be flipped by a decoding operation. That is, although a logic state obtained by applying the soft read reference voltage is the first logic state ($S_0$), there is a chance that the correct logic state should have been the second logic state ($S_1$). Also, although a logic state obtained by applying the soft read reference voltage is the second logic state ($S_1$), there is a chance that the correct logic state should have been the first logic state ($S_0$).

During a decoding process, the incorrectly labeled bits may be corrected. That is, during a decoding process by the decoder in the ECC engine 110, the bits that may be incorrectly labeled as logic state one may be flipped to logic state two and bits that may be incorrectly labeled as logic state two may be flipped to logic state one. The bit values obtained by applying the group of soft read reference voltages may be decoded in a soft decoding process. At the end of a successful soft decoding process, each bit may be given a hard decision of whether it should be the logic one or logic zero.

For a random data pattern, cells of a wordline may be evenly distributed among all states. A wordline may be referred to as a correctable wordline when all errors in any cell states (e.g., all logical pages) of the wordline can be corrected. In one embodiment, pre-decoding cell state information for all cells of a wordline may be collected by a soft read operation for the data stored in all cells of the wordline (e.g., obtaining all logical pages). The pre-decoding cell state information may include number of cells in logic one (e.g., pre-decoding number of 1s) in each zone and number of cells in logic zero (e.g., pre-decoding number of 0s) in each zone.

A decoder of the ECC engine 110 may perform a soft decoding operation on the bit values of cells of a wordline and correct any cell states incorrectly labeled. After successfully decoding a page of data, the correct bit values of the cells of the page may be obtained. Based on the voltage ranges delineated by the group of soft read reference voltages, post-decoding number of 1s of each zone and post-decoding number of 0s of each zone may be determined. To simplify wording, unless explicitly referred to as pre-decoding number of 1s or pre-decoding number of zeros, number of 1s and number of zeros may refer to post-decoding number of 1s and post-decoding number of zeros.

It should be noted that if the data written to the storage device is scrambled, then the data read from the storage device may need to be de-scrambled before being sent to the decoder, and the decoding result data may be need to be scrambled using the same scrambling process. That is, the post-decoding number of 1s and post-decoding number of 0s are obtained from the scrambling process result of hard decision bit values obtained from the soft decoding process.

As an example, the number of 1s in zone 306 may be denoted as $C(1,0)$ with the first index in the parenthesis indicating the state being logic one and the second index in the parenthesis indicating the SI value being 0 (e.g., zone 306; also, the number of 0s in zone 306 may be denoted as $C(0,0)$ with the first index in the parenthesis indicating the state being logic zero and the second index in the parenthesis indicating the SI value being 0 (e.g., zone 306). Using this notation, $C(1,1)$ may be the number of 1s for zone 308 and $C(0,1)$ may be the number of 0s for zone 308, $C(1,2)$ may be the number of 1s for zone 310 and $C(0,2)$ may be the number of 0s for zone 310, $C(1,3)$ may be the number of 1s for zone 312 and $C(0,3)$ may be the number of 0s for zone 312, $C(1,4)$ may be the number of 1s for zone 314 and $C(0,4)$ may be the number of 0s for zone 314, and $C(1,5)$ may be the number of 1s for zone 316 and $C(0,5)$ may be the number of 0s for zone 316. The calculation of $C(i,j)$ may be based on a page (e.g., a physical page of SLC, or a logical page of MLC, TLC, etc.), a group of pages, a block, or a group of blocks.

In various embodiments, for each zone, the number of 1s in one zone may be compared with the number of 0s in the same zone. The comparison result may be referred to as a one-zero relation indicator (OZRI), which may indicate which one of the number of 1s and the number of 0s is greater, or the two numbers being equal. The OZRI for a zone with the SI value j may be denoted by $OZRI(j)$. It may be observed that $OZRI(j)$ may steadily decrease with each increment of j. That is, with the increase of j, for each zone $SI(j)$, the number of 1s may be greater than the number of zeros but the difference may shrink and at some point, the number of zeros may become greater than the number of 1s (e.g., $OZRI(j)$ being a strictly decreasing function of j).

In one embodiment, the comparison may be performed by a subtraction, for example, $OZRI(j)=C(1,j)-C(0,j)$, with j being a number of 0 to 5. In another embodiment, the comparison may be performed by a logarithm of the ratio of the number of 1s to the number of 0s, for example, $OZRI(j)=\log_b(C(1,j)/C(0,j))$, in which the logarithm base b may be any positive integer and j may be the SI value (e.g., 0 to 5). In yet another embodiment, the comparison may be performed by a subtraction with the $OZRI(j)$ being 1 if the subtraction result is larger than zero (e.g., $OZRI(j)=1$ if $C(1,j)>C(0,j)$, being 0 if the subtraction result is zero (e.g., $OZRI(j)=0$ if $C(1,j)=C(0,j)$, and being $-1$ if the subtraction result is less than zero (e.g., $OZRI(j)=-1$ if $C(1,j)<C(0,j)$).

It should be noted that these comparisons are merely examples, any mathematical calculation that illustrates the number of 1s being greater than the number of zeros, the number of 1s being less than the number of zeros, and the two numbers being equal may be used for calculating $OZRI(j)$.

The optimal read reference voltage may be a voltage value where the curve 302 may intersect with the curve 304. As illustrated on FIG. 3A, to the left of this optimal read reference voltage, the number of 1s may be greater than the number of 0s for any reference voltage range, and to the right of this optimal read reference voltage, the number of 1s may be less than the number of 0s for any read reference voltage range. Therefore, assuming the optimal read reference voltage (e.g., optimal Vref) coincidently falls on $Vs_2$, $OZRI(0)$, $OZRI(1)$, and $OZRI(2)$ may be positive, and $OZRI(3)$, $OZRI(4)$, and $OZRI(5)$ may be negative. In some embodiments, an optimization indicator (e.g., OI) may be used to find the zone in which the OZRI changes sign (or becomes zero). In one embodiment, an OI for a soft reference voltage $Vs_0$ may be defined as $OI(Vs_j)=OZRI(j)*OZRI(j+1)$ with j being one of 0 to 4 such that $Vs_0$ may correspond to $Vs_0$, $Vs_1$, $Vs_2$, $Vs_3$, and $Vs_4$. For any two consecutive $OZRI(j)$ and $OZRI(j+1)$ that have the same sign, $OI(Vs_j)$ may be greater than zero. When two consecutive $OZRI(j)$ and $OZRI(j+1)$ have different signs, $OI(Vs_j)$ may be less than zero. For the example shown in FIG. 3A, $OI(Vs_0)$, $OI(Vs_1)$, $OI(Vs_3)$ and $OI(Vs_4)$ may be greater than zero, and $OI(Vs_2)$ may be less than zero.

Figure 3B:
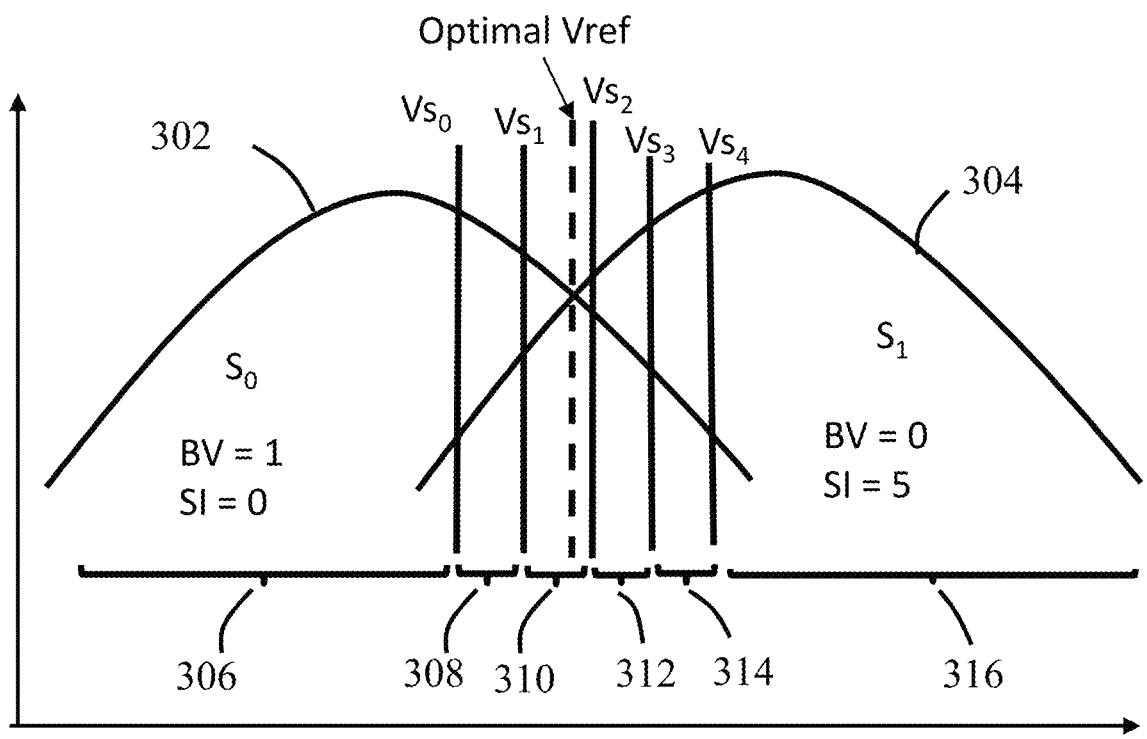
FIG. 3B schematically shows state information of two adjacent states with respect to a group of soft read reference voltages in accordance with an embodiment of the present disclosure.

However, just because $OI(Vs_2)$ may be less than zero, it may be just a coincidence that the optimal reference voltage falls on $Vs_2$. FIG. 3B schematically shows state information of two adjacent states with respect to the same group of soft read reference voltages $Vs_0$, $Vs_1$, $Vs_2$, $Vs_3$, and $Vs_4$ as in FIG. 3A. In the situation of FIG. 3B, same as in FIG. 3A, $OI(Vs_0)$, $OI(Vs_1)$, $OI(Vs_3)$ and $OI(Vs_4)$ may be greater than zero, and $OI(Vs_2)$ may be less than zero. But FIG. 3B may be different from FIG. 3A in that the curve 302 and curve 304 may intersect at an optimal read reference voltage (shown as a dashed vertical line) that may be in the vicinity of $Vs_2$ but less than $Vs_2$.

Figure 3C:
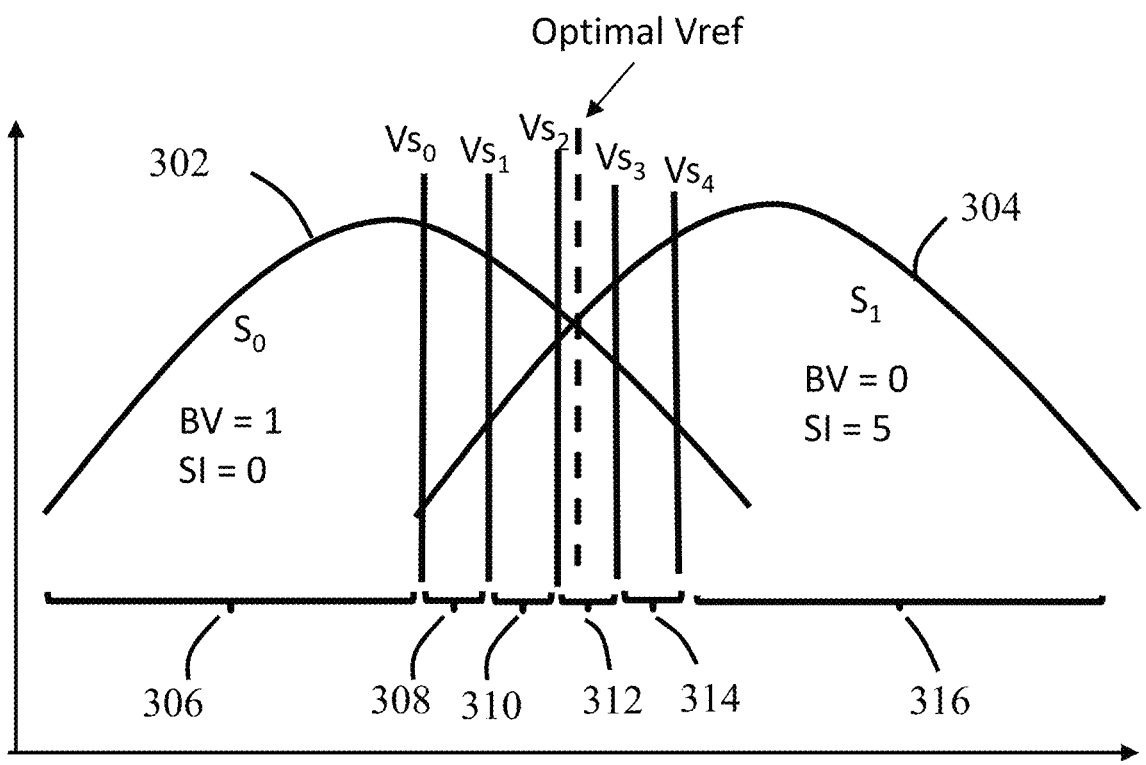
FIG. 3C schematically shows state information of two adjacent states with respect to a group of soft read reference voltages in accordance with an embodiment of the present disclosure.

FIG. 3C schematically shows state information of two adjacent states with respect to the same group of soft read reference voltages $Vs_0$, $Vs_1$, $Vs_2$, $Vs_3$, and $Vs_4$ as in FIG. 3A. In the situation of FIG. 3C, same as in FIG. 3A, $OI(Vs_0)$, $OI(Vs_1)$, $OI(Vs_3)$ and $OI(Vs_4)$ may be greater than zero, and $OI(Vs_2)$ may be less than zero. But FIG. 3C may be different from FIG. 3A in that the curve 302 and curve 304 may intersect at an optimal read reference voltage (shown as a dashed vertical line) that may be in the vicinity of $Vs_2$ but greater than $Vs_2$.

Based on FIGS. 3A, 3B and 3C, it may be determined that when $OI(Vs_t)$ is less than zero for any particular $Vs_t$, where "t" may be any index number from the lowest read reference voltage to the highest read reference voltage of the group of read reference voltages (e.g., 0 to 4), the optimal read reference voltage (optimal Vref or Vref_opt) may be in the vicinity of $Vs_t$ or equal to $Vs_t$. In some embodiments, the optimal Vref may be obtained by making an adjustment to $Vs_t$ (e.g., Vref=$Vs_t$+adjustment) and the adjustment may be any linear function or non-linear function of $OZRI(t)$ and $OZRI(t+1)$.

In one example, the adjustment may be set to equal to an average of $OZRI(t)$ and $OZRI(t+1)$ (e.g., adjustment=(OZRI (t)+OZRI(t+1))/2). In another example, the adjustment may be set to equal to (sign(OZRI(t))*|OZRI(t)|$^{0.5}$+sign(OZRI(t+1))*OZRI(t+1)|$^{0.5}$)/2, in which sign( ) is the function that returns 1 if OZRI(t)>0 or −1 if OZRI(t)<0, and "*" is the multiplication operator.

In yet another example, the adjustment may be set to equal to (|OZRI(t)|+|OZRI(t+1)|)>threshold?OZRI(t): (OZRI(t))*α+OZRI(t+1))*β, which may be a ternary operation (e.g., "?:" a ternary operator). That is, if the sum of the absolute values of OZRI(t) and OZRI(t+1) is greater than a threshold value, the adjustment may be set to equal to OZRI(t), otherwise the adjustment may be set to equal to a linear combination of OZRI(t) and OZRI(t+1), in which alpha (α) and beta (β) may be positive numbers with α+β=1. For example, α may be 0.5 and β may be 0.5.

In a further example, the adjustment may be set to equal to ((|OZRI(t)|+|OZRI(t+1)|)>THR)?((|OZRI(t+1)|>THR) ?OZRI(t)*γ:OZRI(t+1)*δ):OZRI(t)*α+OZRI(t+1)*β, which may be a nested ternary operation (e.g., "?(?:):" a nested ternary operator). That is, if the sum of the absolute values of OZRI(t) and OZRI(t+1) is greater than a threshold value THR, further determine whether the absolute value of OZRI(t+1) is greater than the threshold value. If the absolute value of OZRI(t+1) is greater than the threshold value, the adjustment may be set to OZRI(t)*γ, in which gamma (γ) may be a positive number. If the absolute value of OZRI(t+1) is not greater than the threshold value, the adjustment may be set to OZRI(t+1)*δ, in which delta (δ) may be a positive number. If the sum of the absolute values of OZRI(t) and OZRI(t+1) is not greater than the threshold value, the adjustment may be set to equal to a linear combination of OZRI(t) and OZRI(t+1), in which alpha (α) and beta (β) may be positive numbers with α+β=1. As an example, thr=2.5, γ=1, δ=1, α=0.5, β=0.5.

In some embodiments, the coefficients γ, δ, α, β and the threshold value THR may be obtained by experiments. For example, in a controlled environment such as in a lab, many tests may be performed and data may be collected, various values for the coefficients may be tried and appropriate values may be selected. In some tests, the optimal read reference values may be obtained by other approaches, such as read scans and various values for the coefficients may be tried to determine the appropriate values. Moreover, these values may be programmable and may be adjusted overtime. For example, these values may change overtime during the lifetime of the NVM storage device 104. The controller 102 may be updated (e.g., a firmware update) with the selected values for the coefficients and threshold value.

Figure 3D:
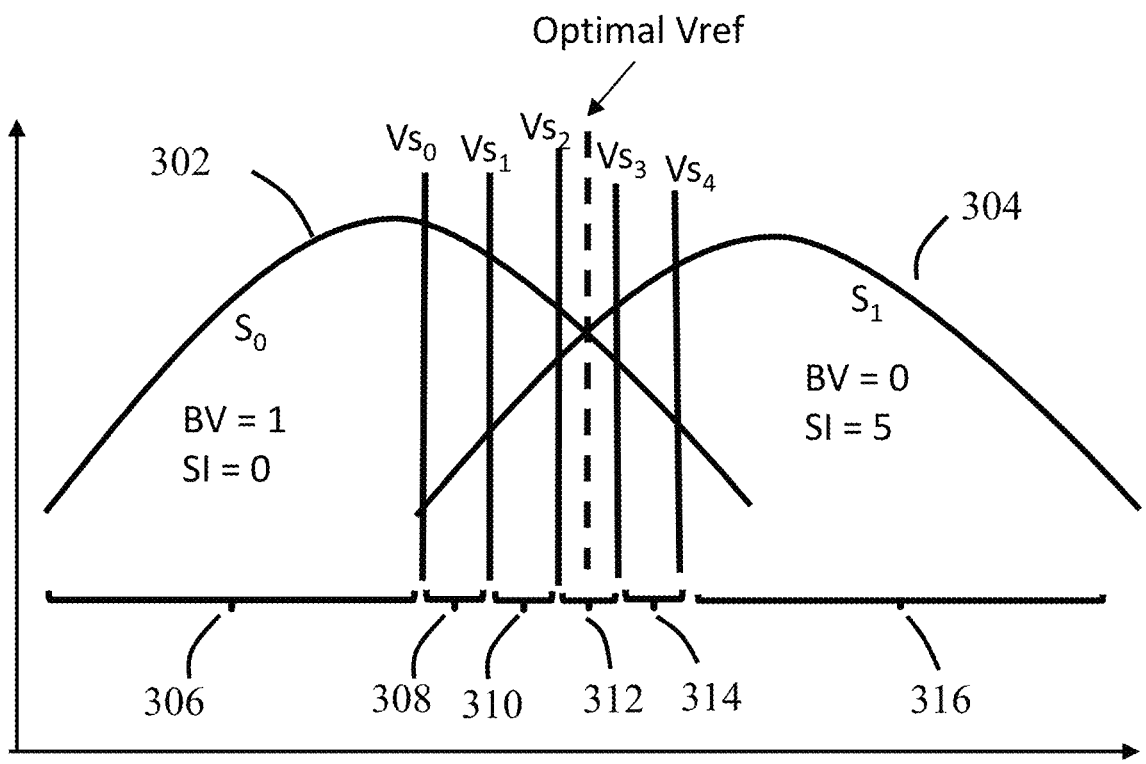
FIG. 3D schematically shows state information of two adjacent states with respect to a group of soft read reference voltages in accordance with an embodiment of the present disclosure.

FIG. 3D schematically shows state information of two adjacent states with respect to the same group of soft read reference voltages $Vs_0$, $Vs_1$, $Vs_2$, $Vs_3$, and $Vs_4$ as in FIGS. 3A, 3B and 3C. In contrast to FIGS. 3A, 3B and 3C, for FIG. 3D, OZRI(0), OZRI(1) and OZRI(2) may be positive, OZRI(3) may be zero, OZRI(4) and OZRI(5) may be negative. That is, the optimal Vref may be positioned inside zone 312 and between the first boundary (e.g., $Vs_2$) and the second boundary of zone 312 (e.g., $Vs_3$). Therefore, for FIG. 3D, OI($Vs_0$), OI($Vs_1$), and OI($Vs_4$) may be greater than zero, but OI($Vs_2$) and OI($Vs_3$) may be equal to zero. In this situation, the Vref_opt may be set to equal to a value higher than $Vs_2$ and lower than $Vs_3$. In some embodiment, Vref_opt may be obtained based on both $Vs_2$ and Vs. For example, Vref_opt may be set to equal to $f_1(Vs_i, Vs_{i+1})$, in which $f_1(Vs_i, Vs_{i+1})$ may be a linear function or non-linear function of $Vs_i$, $Vs_{i+1}$. In one example, $f_1(Vs_i, Vs_{i+1})=Vs_i*\alpha1+Vs_{i+1}*\beta1$, with α1 and β1 being positive numbers and α1+β1=1 (e.g., α1=0.4 and β1=0.6). In another example, $f_1(Vs_i, Vs_{i+1})=(Vs_i^2+Vs_{i+1}^2)^{0.5}/2$. In some embodiments, the coefficients α1 and β1 may also be obtained by experiments.

Figure 4A:
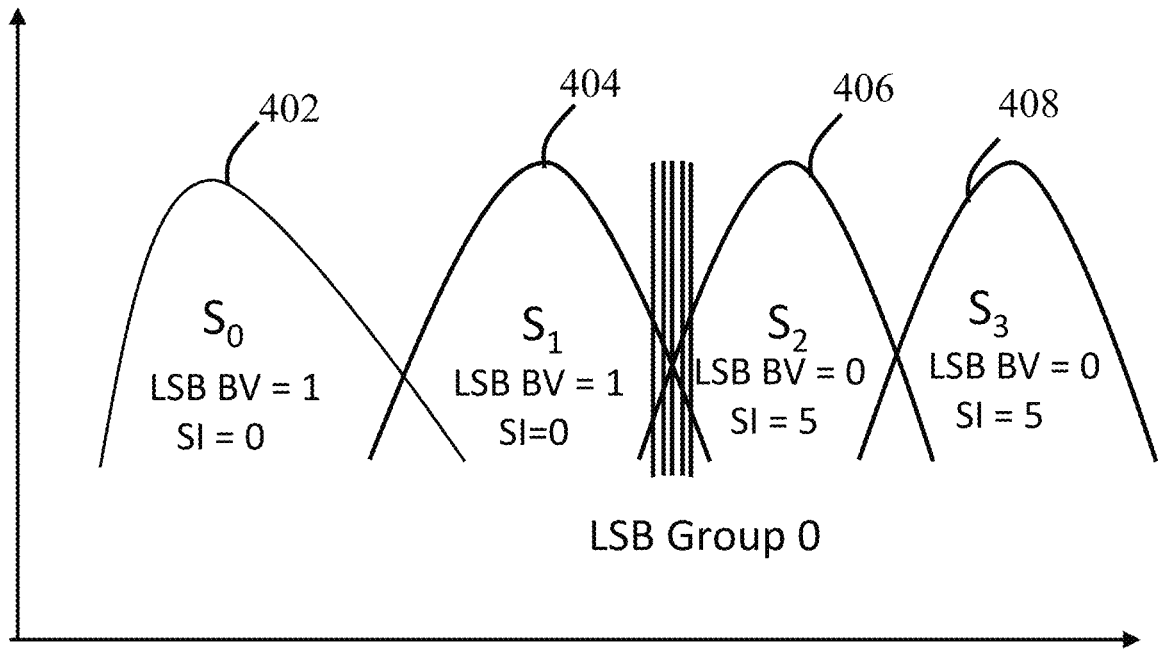
FIG. 4A and FIG. 4B schematically show state information of MLC cells with respect to groups of soft read reference voltages in accordance with an embodiment of the present disclosure.
Figure 4B:
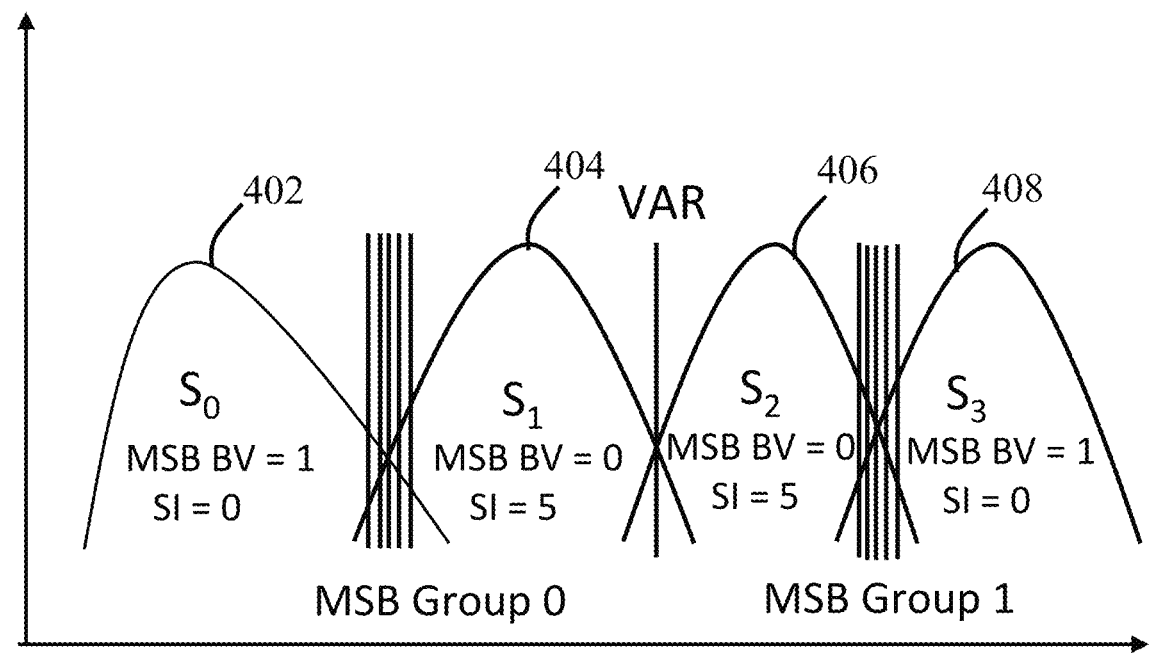

FIGS. 4A and 4B schematically show state information of MLC cells with respect to groups of soft read reference voltages in accordance with an embodiment of the present disclosure. Data stored in MLC cells may contain two-bits of information in four states. The curve 402 may indicate distribution of cells in a first logic state ($S_0$), the curve 404 may indicate distribution of cells in a second logic state ($S_1$), the curve 406 may indicate distribution of cells in a third logic state ($S_2$), the curve 408 may indicate distribution of cells in a fourth logic state ($S_3$). As shown in FIG. 4A, an LSB page of MLC cells may need one group of soft read reference voltages (e.g., LSB group 0) positioned around the intersection of the curve 404 and the curve 406 for a soft read operation. The LSB bits may be logic one for curves 402 and 404 (e.g., BV=1), and logic zero for curves 406 and 408 (e.g., BV=0). The SI values for the zones delineated by the soft read reference voltages of LSB group 0 may increase from left to right with the left most zone having SI=0 and the right most zone having SI=5, and zones in between having SI being 1, 2, 3, 4, respectively, just as the zones in FIGS. 3A-3D.

As shown in FIG. 4B, an MSB page for MLC cells may need two groups of soft read reference voltages for a soft read operation, e.g., MSB group 0 around the intersection of the curves 402 and 404, and MSB group 1 around the intersection of the curves 406 and 408. The MSB bits may be logic one for curves 402 and 408 (e.g., BV=1), and logic zero for curves 404 and 406 (e.g., BV=0). The soft information values for zones delineated by the soft read reference voltages of MSB group 0 may increase from left to right with the left most zone having SI=0 (e.g., zone SI(0)) and the right most zone having SI=5 (e.g., zone SI(5)), and zones in between having SI being 1, 2, 3, 4, respectively, just as the zones in FIGS. 3A-3D. The soft information values for zones delineated by the soft read reference voltages of CSB group 1 may decrease from left to right with the left most zone having SI=5 (e.g., zone SI(5)) and the right most zone having SI=0 (e.g., zone SI(0)), and zones in between having SI being 4, 3, 2, 1, respectively.

Although the soft information values for zones delineated by the soft read reference voltages of some groups (e.g., MSB group 1) may decrease from left to right, the OZRI(j) for these zones is still a strictly decreasing function of j and the optimal read reference voltage may still be obtained based on the number of 1s and number of 0s in each zone. For example, two adjacent zones may have different signs of OZRI (e.g., as the situations in FIG. 3A, 3B or 3C) or one zone may have the OZRI being zero (as the situation in FIG. 3D).

It should be noted that although the optimal read reference voltages for multiple groups of soft read reference voltages may be obtained after one soft read operation, each of the optimal read reference voltages may be determined independently by OZRIs of zones delineated by a respective group of soft read reference voltages. That is, the optimal read reference voltage for MSB group 0 may be determined by OZRIs of zones delineated by the soft read reference voltages of MSB group 0, and may be obtained based on either OI($Vs_t$) is less than zero for a particular $Vs_t$ or OZRI is equal to zero for a particular zone. The optimal read reference voltage for MSB group 1 may be determined by OZRIs of zones delineated by the soft read reference voltages of MSB group 1, and may be obtained based on either OI($Vs_t$) is less than zero for a particular $Vs_t$ or OZRI is equal to zero for a particular zone.

In some embodiments, the pre-decoding state information returned by the non-volatile storage device 104 for a soft read operation may include bit values, total numbers of 1s from two zones of the same SI values for each SI value and total numbers of zeros from two zones of the same SI value for each SI value. That is, the number of 1s associated with an SI value of j is a sum of the number of 1s in zone SI(j)) of MSB group 0 and number of 1s in zone SI(j) of MSB group 1. For example, a bit value of 1 in a zone of SI value being 0 may be in state $S_0$ (e.g., curve 402) or in state $S_3$ (e.g., curve 408). Therefore, in some embodiments, an additional read using a hard decision threshold voltage VAR may be performed in addition to the soft read operation. The controller 102 may obtain further information from the additional read and determine whether a cell's threshold voltage is less than VAR so that the corresponding post-decoding bit value may be counted for the zones delineated by group 0, or greater than VAR so that the corresponding post-decoding bit value may be counted for the zone delineated by group 1.

Figure 5A:
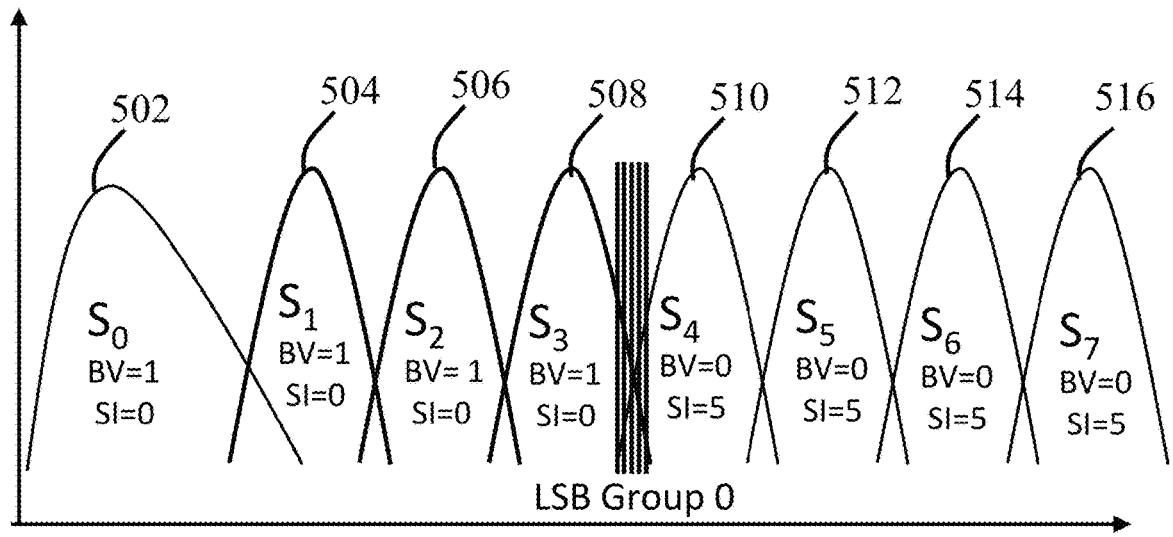
FIG. 5A, FIG. 5B and FIG. 5C schematically show state information of TLC cells with respect to groups of soft read reference voltages in accordance with an embodiment of the present disclosure.
Figure 5B:
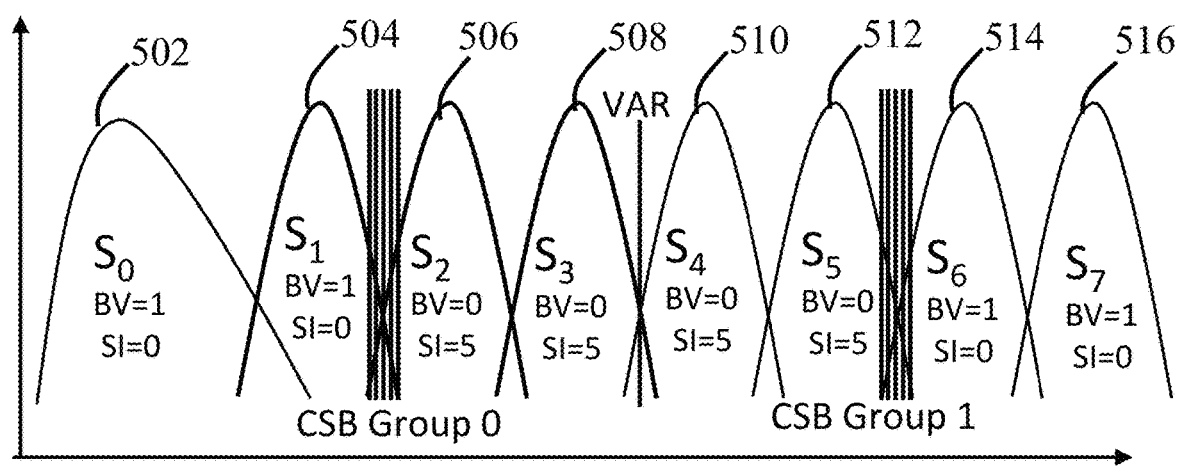
Figure 5C:
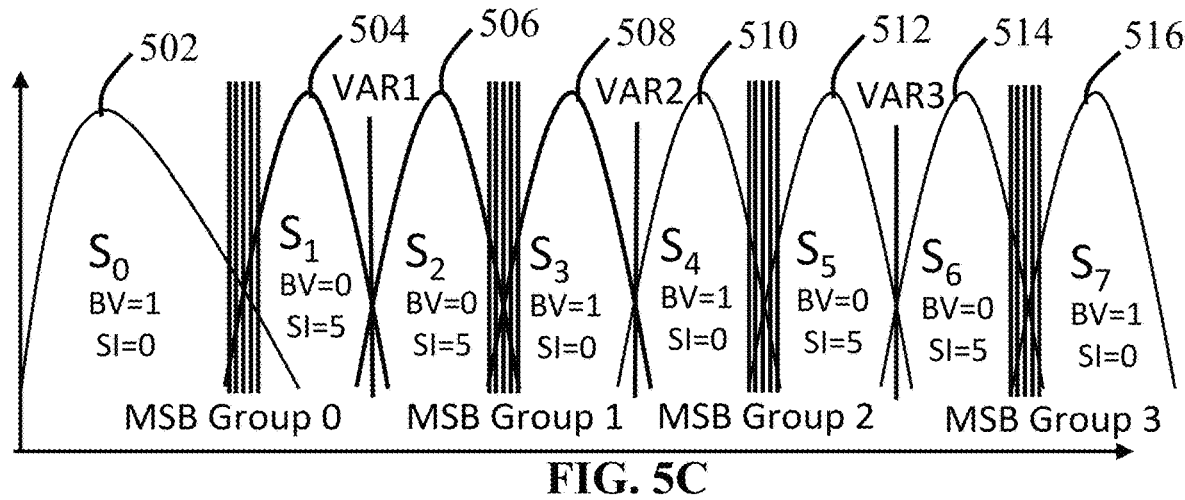

FIG. 5A, FIG. 5B and FIG. 5C schematically show state information of TLC cells with respect to groups of soft read reference voltages in accordance with an embodiment of the present disclosure. Data stored in TLC cells may contain 3-bits of information in eight states. The curve 502 may indicate distribution of cells in a first logic state ($S_0$), the curve 504 may indicate distribution of cells in a second logic state ($S_1$), the curve 506 may indicate distribution of cells in a third logic state ($S_2$), the curve 508 may indicate distribution of cells in a fourth logic state ($S_3$), the curve 510 may indicate distribution of cells in a fifth logic state ($S_4$), the curve 512 may indicate distribution of cells in a sixth logic state ($S_5$), the curve 514 may indicate distribution of cells in a seventh logic state ($S_6$), the curve 516 may indicate distribution of cells in an eighth logic state ($S_7$). As shown in FIG. 5A, an LSB page of TLC cells may need one group of soft read reference voltages (e.g., LSB group 0) positioned around the intersection of the curve 508 and the curve 510 for a soft read operation. The LSB bits may be logic one for curves 502, 504, 506 and 508 (e.g., BV=1), and logic zero for curves 510, 512, 514 and 516 (e.g., BV=0). The SI values for the zones delineated by the soft read reference voltages of LSB group 0 may increase from left to right with the left most zone having SI=0 and the right most zone having SI=5, and zones in between having SI being 1, 2, 3, 4, respectively, just as the zones in FIGS. 3A-3D.

As shown in FIG. 5B, a CSB page for TLC cells may need two groups of soft read reference voltages for a soft read operation, e.g., CSB group 0 around the intersection of the curves 504 and 506, and CSB group 1 around the intersection of the curves 510 and 512. The CSB bits may be logic one for curves 502, 504, 514 and 516 (e.g., BV=1), and logic zero for curves 506, 508, 510 and 512 (e.g., BV=0). The soft information values for zones delineated by the soft read reference voltages of CSB group 0 may increase from left to right with the left most zone having SI=0 (e.g., zone SI(0)) and the right most zone having SI=5 (e.g., zone SI(5)), and zones in between having SI being 1, 2, 3, 4, respectively, just as the zones in FIGS. 3A-3D. But the soft information values for zones delineated by the soft read reference voltages of CSB group 1 may decrease from left to right with the left most zone having SI=5 (e.g., zone SI(5)) and the right most zone having SI=0 (e.g., zone SI(0)), and zones in between having SI being 4, 3, 2, 1, respectively.

Because the CSB page of the TLC cells need two groups of soft read reference voltages, in some embodiments, an additional read using a hard decision threshold voltage VAR may be performed in addition to the soft read operation. The controller 102 may obtain further information from the additional read and determine whether a cell's threshold voltage is less than VAR so that the corresponding post-decoding bit value may be counted for the zones delineated by CSB group 0, or greater than VAR so that the corresponding post-decoding bit value may be counted for the zone delineated by CSB group 1.

As shown in FIG. 5C, an MSB page for TLC cells may need four groups of soft read reference voltages for a soft read operation, e.g., MSB group 0 around the intersection of the curves 502 and 504, MSB group 1 around the intersection of the curves 506 and 508, MSB group 2 around the intersection of the curves 510 and 512, and MSB group 1 around the intersection of the curves 514 and 516. The MSB bits may be logic one for curves 502, 508, 510 and 516 (e.g., BV=1), and logic zero for curves 504, 406, 512 and 514 (e.g., BV=0). The soft information values for zones delineated by the soft read reference voltages of MSB group 0 and MSB group 2 may increase from left to right, and the soft information values for zones delineated by the soft read reference voltages of MSB group 1 and MSB group 3 may decrease from left to right. Because the MSB page of the TLC cells need four groups of soft read reference voltages, in some embodiments, additional reads using hard decision threshold voltages VAR1, VAR2 and VAR3 may be performed in addition to the soft read operation. The controller 102 may obtain further information from the additional reads and determine a cell's threshold voltage is in a SI zone of delineated by which MSB group.

In general, if a logical page of a multi-bit value cells may need k groups of soft read reference voltages for a soft read operation, additional (k-1) read operations may be needed for different groups of soft read reference voltages. In some embodiments, additional read result may not be available. In these embodiments, decoding results from a correctable wordline may be used to distinguish the number of 1s and number 0s from different groups of soft read reference voltages. Even in embodiments that decoding results from a correctable wordline may be used to distinguish between different groups of soft read reference voltages, additional read(s) may still be useful. For example, sometimes, some pages of a wordline may not be available, such as in a random read, there is no guarantee that all pages of a wordline will be read. In embodiments that additional reads may be available, the result of addition reads may be the same as hard reads. In the examples of FIGS. 4B and 5B, the result of VAR read may be the same as a hard read for a LSB read when VAR is used as the hard read Vref for the LSB page. In the example of FIG. 5C, VAR2 may be considered as a hard read for the LSB page, and VAR1 and VAR3 may be considered as a hard read for the CSB page.

Figure 6:
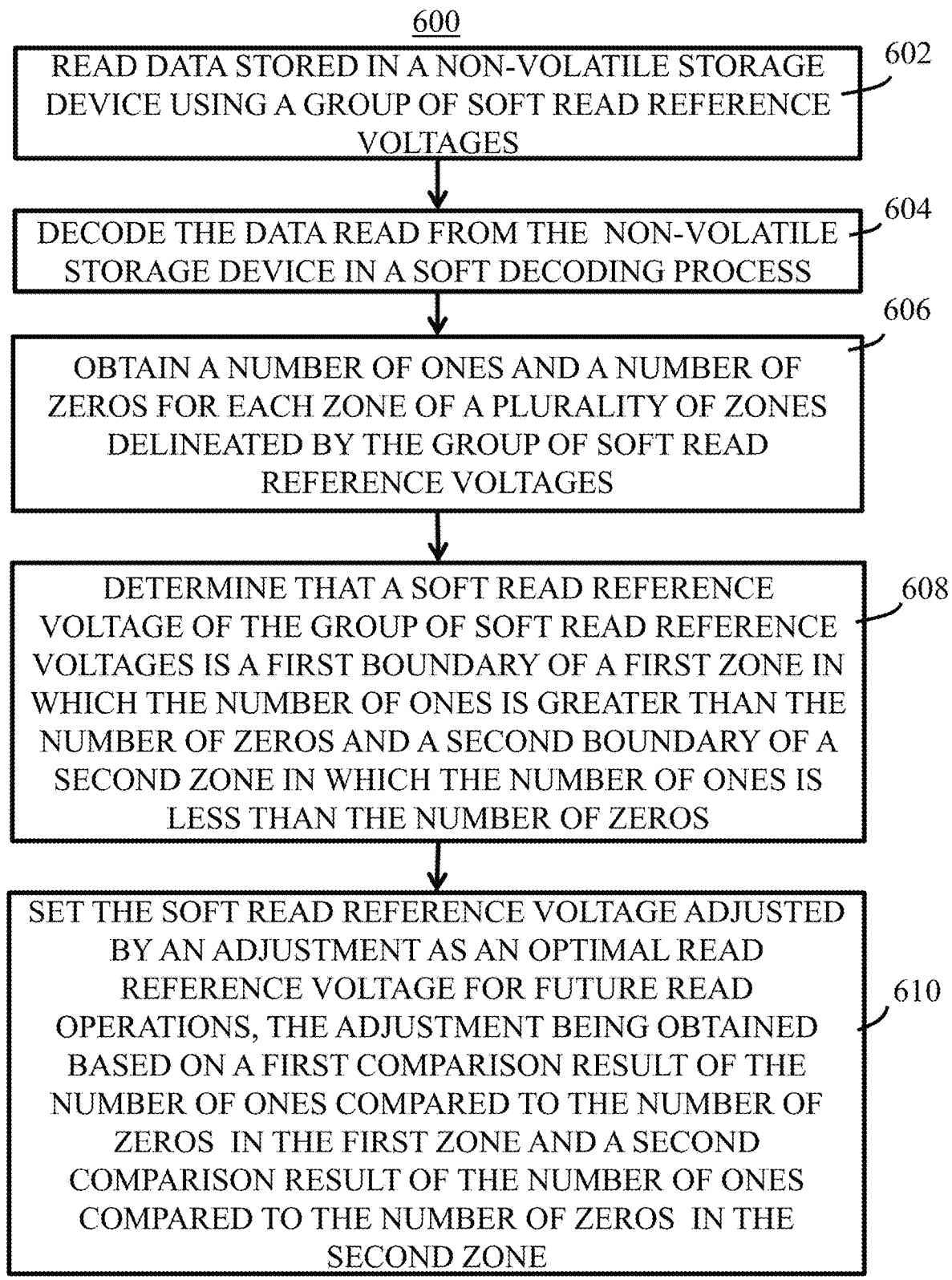
FIG. 6 schematically shows a process for obtaining an optimal read reference voltage in accordance with an embodiment of the present disclosure.

FIG. 6 is a flow diagram of a process 600 for obtaining an optimal read reference voltage in accordance with an embodiment of the present disclosure. At block 602, data stored in a non-volatile storage device may be read using a group of soft read reference voltages. For example, the controller 102 may send a command to the non-volatile storage device 104 to read data stored in the non-volatile storage device 104. The command may specify that a group of soft read reference voltages (e.g., $Vs_0$, $Vs_1$, $Vs_2$, $Vs_3$, and $Vs_4$ of FIG. 3A) may be applied to a wordline to read bit values stored in cells of the wordline. The group of soft read reference voltages may be for reading data of one physical page for SLC or reading data of an LSB page (e.g., MLC or TLC), or may be one group of multiple groups for reading data of a logical page that needs multiple groups of soft read reference voltages for one soft read operation (e.g., MSB group 0 or MSB group 1 of MLC).

At block 604, the data read from the non-volatile storage device may be decoded in a soft decoding process. For example, the decoder of the ECC engine 110 may perform a soft decoding operation on the data read from the non-volatile storage device 104. The soft decoding operation may correct any cell bit values incorrectly labeled. In the embodiments that encoded data may be scrambled before being written to the non-volatile storage device, the data read from the non-volatile storage device may be de-scrambled before decoded.

At block 606, a number of ones and a number of zeros may be obtained for each zone of a plurality of zones delineated by the group of soft read reference voltages. The number of ones and number of zeros here may refer to the post-decoding number of ones and post-decoding number of zeros. As an example, as shown in FIG. 3A, the groups of soft read reference voltages $Vs_0$, $Vs_1$, $Vs_2$, $Vs_3$, and $Vs_4$ may delineate a plurality of zones (e.g., zones 306, 308, 310, 312, 314 and 316) with each zone having a different soft information value. The controller 102 may obtain number of ones and number of zeros C(i,j) for each zone, with the first index "i" being one or zero and the second index "j" being the soft information value for each zone. In the embodiments that encoded data may be scrambled before being written to the non-volatile storage device, decoding result hard decisions may be scrambled and C(i,j) may be obtained from scrambled hard decisions of soft decoding result.

At block 608, it may be determined that a soft read reference voltage of the group of soft read reference voltages is a first boundary of a first zone in which the number of ones is greater than the number of zeros and a second boundary of a second zone in which the number of ones is less than the number of zeros. For example, the number of ones and number of zeros may be compared for each zone by the controller 102 (e.g., subtraction, logarithm of division, etc.). The comparison results (e.g., one-zero relation indicators OZRIs) may show a pattern that the differences between the number of ones and number of zeros for each zone may strictly decease and change from positive to negative with the increase of the soft information values for each zone (e.g., OZRI(j) being a strictly decreasing function of j). When the state distributions with respect to the group of soft read reference voltages may be as shown in FIGS. 3A, 3B and 3C, the controller 102 may determine that $Vs_2$ may be one boundary of zone 310 (e.g., zone SI(2)), which may be a first zone in which the number of ones may be greater than the number of zeros, and also a boundary of zone 312 (e.g., zone SI(3)), which may be a second zone in which the number of ones may be less than the number of zeros.

It should be noted that the SI values may increase with increase of the threshold voltage values for zones delineated by some groups of soft read reference voltages (e.g., SLC, LSB of MLC and MSB group 0 of MLC, LSB of TLC, CSB group 0 of TLC, MSB groups 0 and 2 of TLC), and the SI values may also decrease with increase of the threshold voltage values for zones delineated by some other groups of soft read reference voltages (e.g., MSB group 1 of MLC, CSB group 1 of TLC and MSB groups 1 and 3 of TLC). But in any case, the one-zero relation indicator OZRI(j) may be a strictly decreasing function of the soft information value j. Therefore, block 608 is applicable in both situations.

At block 610, the soft read reference voltage adjusted by an adjustment may be set as an optimal read reference voltage for future read operations. The adjustment may be obtained based on a first comparison result of the number of ones compared to the number of zeros in the first zone and a second comparison result of the number of ones compared to the number of zeros in the second zone. As illustrated in FIGS. 3A, 3B and 3C, when there is no zone that has an equal number of the number of ones and the number of zeros (e.g., OZRI(j) is not zero for any j). The optimal Vref may be close to or located at the soft read reference voltage $Vs_t$ that sits between the two neighboring zones in one of which the number of ones is greater than the number of zeros and in another one of which the number of ones is less than the number of zeros. In various embodiments, the optimal Vref may be obtained by making an adjustment to $Vs_t$ (e.g., Vref=$Vs_t$+adjustment) and the adjustment may be any linear function or non-linear function of OZRI(t) and OZRI(t+1). For the situation of FIGS. 3A, 3B and 3C, $Vs_t$ may be $Vs_2$, and the adjustment may be any linear function or non-linear function of OZRI(2) and OZRI(3). The optimal Vref obtained may be used in future read operations, including used as the hard decision threshold voltages for future hard read operations.

Figure 7:
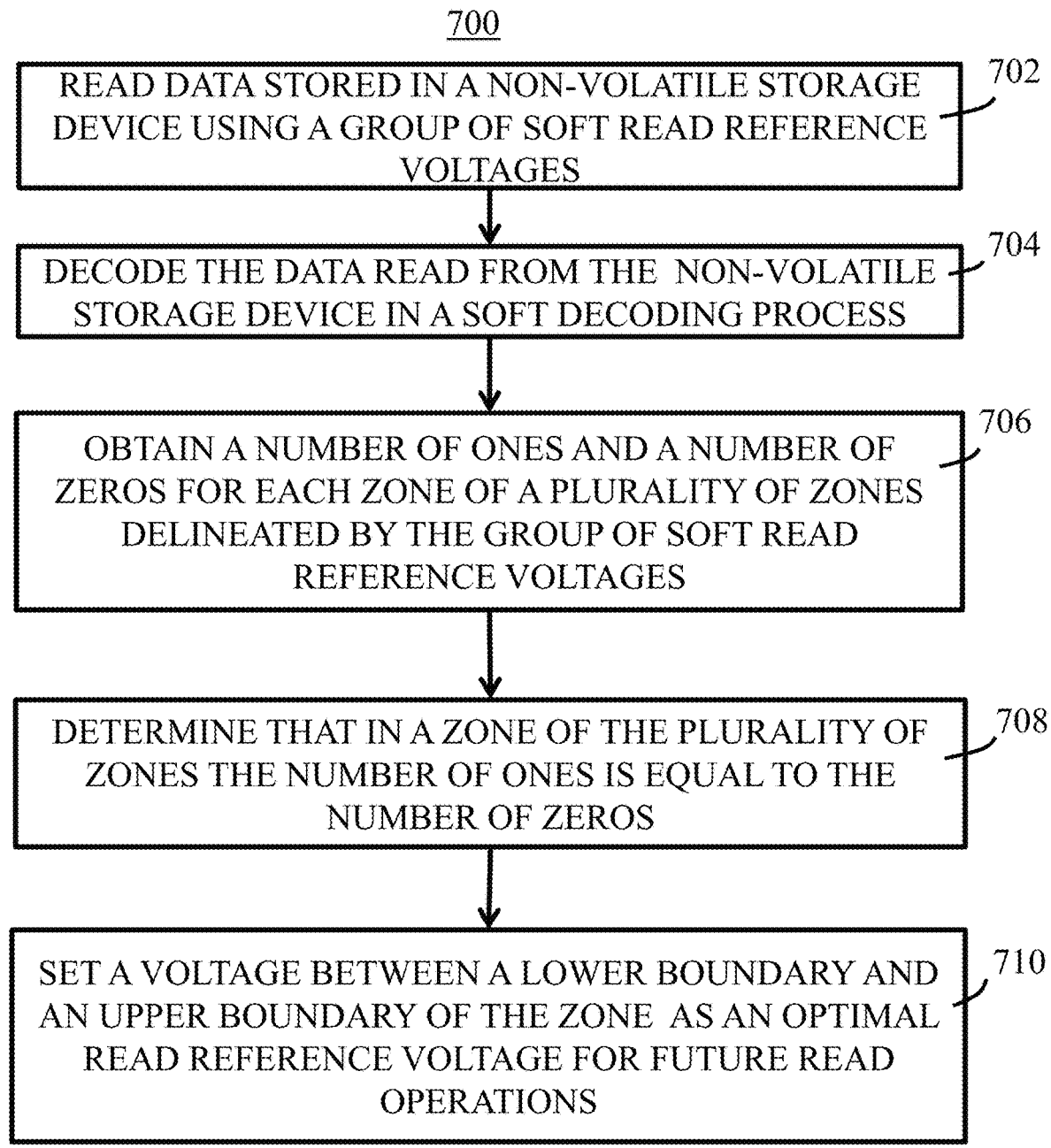
FIG. 7 is a flow diagram of a process for obtaining an optimal read reference voltage in accordance with an embodiment of the present disclosure.

FIG. 7 is a flow diagram of a process 700 for obtaining an optimal read reference voltage in accordance with an embodiment of the present disclosure. At block 702, data stored in a non-volatile storage device may be read using a group of soft read reference voltages. At block 704, the data read from the non-volatile storage device may be decoded in a soft decoding process. At block 706, a number of ones and a number of zeros may be obtained for each zone of a plurality of zones delineated by the group of soft read reference voltages. Blocks 702, 704 and 706 may be identical to blocks 602, 604 and 606 of the process 600.

At block 708, it may be determined that in one particular zone of the plurality of zones the number of ones is equal to the number of zeros. The number of ones and number of zeros may be compared for each zone by the controller 102 (e.g., subtraction, logarithm of division, etc.). The comparison results (e.g., one-zero relation indicators OZRIs) may show a pattern that the differences between the number of ones and number of zeros for each zone may strictly decease and change from positive to negative with the increase of the soft information values for each zone (e.g., OZRI(j) being a strictly decreasing function of j). When the state distributions may be as shown in FIG. 3D, the controller 102 may determine that the number of ones may be equal to the number of zeros in the particular zone 312.

At block 710, a voltage between a lower boundary and an upper boundary of the zone may be set as an optimal read reference voltage for future read operations. When one zone has the equal number of the number of ones and number of zeros, the optimal Vref may be positioned between the two boundaries of the zone. As shown in the example of FIG. 3D, the optimal Vref may be located at a voltage higher than $Vs_2$ and lower than $Vs_3$. In some embodiment, Vref_opt may be set to equal to $f_1(Vs_1, Vs_{i+1})$, in which $f_1(Vs_1, Vs_{i+1})$ may be a linear function or non-linear function of $Vs_1$, $Vs_{i+1}$. The optimal Vref obtained may be used in future read operations, including used as the hard decision threshold voltages for future hard read operations.

Figure 8:
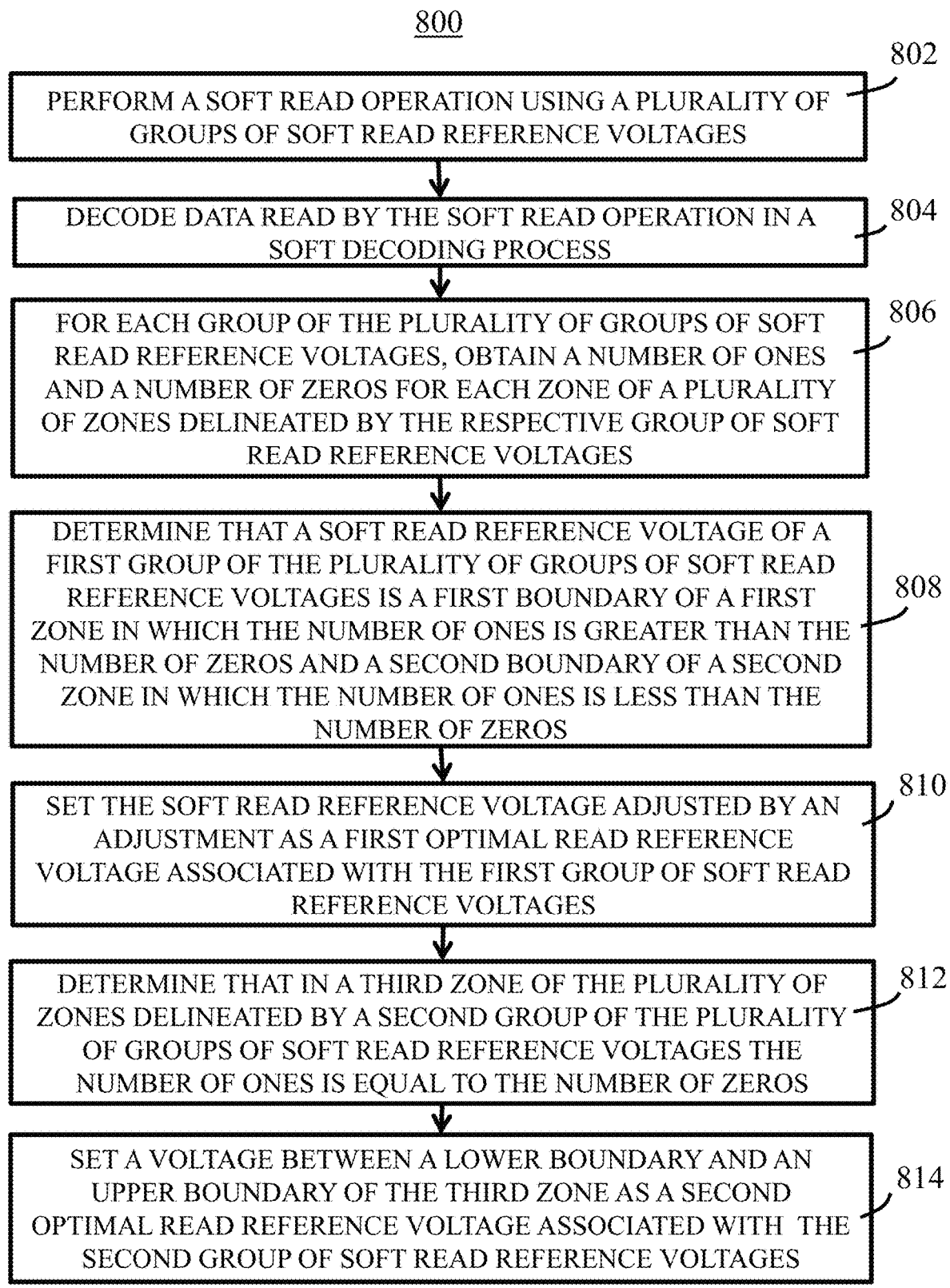
FIG. 8 is a flow diagram of a process for obtaining a plurality of optimal read reference voltages in accordance with an embodiment of the present disclosure.

FIG. 8 is a flow diagram of a process for obtaining a plurality of optimal read reference voltages in accordance with an embodiment of the present disclosure. At block 802, a soft read operation using a plurality of groups of soft read reference voltages may be performed. For example, to read a logical page such as an MSB for MLC cells or CSB/MSB for TLC cells, multiple groups of soft read reference voltages may be used, as illustrated in FIGS. 4B, 5B and 5C. At block 804, data read by the soft read operation may be decoded in a soft decoding process. At block 806, for each group of the plurality of groups of soft read reference voltages, a number of ones and a number of zeros for each zone of a plurality of zones delineated by the respective group of soft read reference voltages may be obtained. For example, the post-decoding number of ones and number of zeros for each zone of the zones delineated by soft read reference voltages of MSB group 0 and MSB group 1 of MLC cells shown in FIG. 4B may be obtained.

At block 808, it may be determined that a soft read reference voltage of a first group of the plurality of groups of soft read reference voltages is a first boundary of a first zone in which the number of ones is greater than the number of zeros and a second boundary of a second zone in which the number of ones is less than the number of zeros. For example, the first group of the plurality of groups of soft read reference voltages may be MSB group 0 of FIG. 4B, and the soft read reference voltages of FIGS. 3A, 3B and 3C may be the soft read reference voltages of MSB group 0 of FIG. 4B shown in detail. The controller 102 may determine that $Vs_2$ may be one boundary of zone 310, which may be a first zone in which the number of ones may be greater than the number of zeros, and also a boundary of zone 312, which may be a second zone in which the number of ones may be less than the number of zeros.

At block 810, the soft read reference voltage adjusted by an adjustment may be set as a first optimal read reference voltage associated with the first group of soft read reference voltages. For example, the optimal read reference voltage Vref associated with MSB group 0 of FIG. 4B may be obtained by making an adjustment to $Vs_t$ (e.g., $Vref = Vs_t +$ adjustment) and the adjustment may be any linear function or non-linear function of OZRI(t) and OZRI(t+1).

At block 812, it may be determined that in a third zone of the plurality of zones delineated by a second group of the plurality of groups of soft read reference voltages the number of ones is equal to the number of zeros. For example, MSB group 1 for the MLC cells shown in FIG. 4B may the second group of the plurality of groups of soft read references for the soft read operation. Although the soft information values for the zones delineated by soft read reference voltages of MSG group 1 may decrease from left to right (e.g., with the increase of the reference voltages), OZRI(j) is still a strictly decreasing function of j and may be zero for one particular zone. At block 814, a voltage between a lower boundary and a higher boundary of the particular zone may be set as a second optimal read reference voltage associated with the second group of soft read reference voltages. For example, once the controller 102 may determine that a particular zone delineated by a group of soft read reference voltages has the equal number of the number of ones and number of zeros, the optimal Vref may be positioned between the two boundaries of the zone as illustrated in FIG. 3D, regardless the SI values for the zones may increase from left to right in FIG. 3D but the zones delineated by MSB group 1 in FIG. 4B may decrease from left to right.

The processes 600, 700 and 800 and features of the non-volatile storage system 100 related to tracking read reference voltage(s) may be implemented using software (e.g., executable by a computer processor (CPU, GPU, or both)), hardware (e.g., a field-programmable gate array (FPGA) or an application-specific IC (ASIC), firmware, or any suitable combination of the three. In one embodiment, for example, the processes 600, 700 and 800 and features of the non-volatile storage system 100 related to tracking read reference voltage(s) may be programmed in computer processor executable instructions, stored in a non-transitory machine-readable medium (e.g., the memory 108, the non-volatile storage device 104, hard drive, CD, DVD, etc.) and performed by the processor 106 (e.g., a microprocessor or a microcontroller) executing the executable instructions.

Embodiments may use the group of read reference voltages for differentiating two adjacent states to delineate cell threshold distribution into zones or regions. The new optimal read reference voltages may be obtained for all groups of soft read reference voltages of a page at the same time. For NVM cells each storing a one-bit value (e.g., SLC), a group of soft read reference voltages may be used in a soft read operation to read data. For NVM cells each storing a multi-bit value (e.g., MLC or TLC), one or more groups of read reference voltages may be used in a soft read operation (e.g., one group for LSB of MLC and LSB of TLC, two groups for MSB of MLC and CSB of TLC, and four groups for MSB of TLC). Optimal read reference voltages corresponding to each of group of read reference voltages may be tracked and obtained at the same time while performing a normal soft read operation.

In some embodiments, if a page has multiple groups of soft read reference voltages, additional read operations may be needed but not required. Moreover, because calculation of C(i,j) may be based on a page (e.g., a physical page of SLC, or a logical page of MLC, TLC, etc.), a group of pages, a block, or a group of blocks, the optimal read reference voltage may be tracked page-wise, group-page-wise, block-wise or group-block-wise.

Furthermore, in various embodiments, read performance may be improved because Vref change may be tracked more accurately and there is no need to halt normal data operations to perform read scan, which could potentially impact system performance. In addition, the read reference voltage tracking in the embodiments may be more accurate by looking at the state distribution of all cells of a page.

In an exemplary embodiment, there is provided a method that may comprise reading data stored in a non-volatile storage device using a group of soft read reference voltages, decoding the data read from the non-volatile storage device in a soft decoding process, obtaining a number of ones and a number of zeros for each zone of a plurality of zones delineated by the group of soft read reference voltages, determining that a soft read reference voltage of the group of soft read reference voltages is a first boundary of a first zone in which the number of ones is greater than the number of zeros and a second boundary of a second zone in which the number of ones is less than the number of zeros, and setting the soft read reference voltage adjusted by an adjustment as an optimal read reference voltage for future read operations. The adjustment may be obtained based on a first comparison result of the number of ones compared to the number of zeros in the first zone and a second comparison result of the number of ones compared to the number of zeros in the second zone.

In one embodiment, the adjustment may be a linear function or a non-linear function of the first comparison result and the second comparison result.

In one embodiment, the adjustment may be determined by a nested ternary operation as adjustment=((|OZRI1|+|OZRI2|)>THR)?((|OZRI2|>THR)?OZRI1*γ:OZRI2*δ): OZRI1*α+OZRI2*β, in which OZRI1 may be the first comparison result, OZRI2 may be the second comparison result, THR may be a threshold value, "*" may be a multiplication operator, γ, δ, α and β may be positive numbers.

In one embodiment, the first comparison result and the second comparison result may be obtained by the number of ones minus number of zeros in the first zone and the second zone, respectively.

In one embodiment, the first comparison result and the second comparison result may be obtained by a logarithm of a division result of the number of ones divided by the number of zeros in the first zone and the second zone, respectively.

In one embodiment, the method may further comprise de-scrambling the data read from the non-volatile storage device before decoding the data.

In one embodiment, the non-volatile storage device may contain cells that each may be configured to store a multi-bit value, the group of soft read reference voltages may be one of a plurality of groups of soft read reference voltages used in a soft read operation for one logical page, each group of the groups of soft read reference voltages may have a corresponding optimal read reference voltage obtained based on numbers of ones and number of zeros in zones delineated by the plurality of groups of soft read reference voltages.

In one embodiment, the method may further comprise performing one or more additional reads for the logical page using one or more hard decision threshold voltages.

In one embodiment, the method may further comprise: determining that the number of ones is equal to the number of zeros in a particular zone of a second plurality of zones delineated by a second group of soft read reference voltages of the plurality of groups of soft read reference voltages, and setting a voltage value between a first soft read reference voltage and a second soft read reference voltage as a second optimal read reference voltage corresponding to the second group of soft read reference voltages for future read operations. The first soft read reference voltage may be a lower boundary of the particular zone and the second soft read reference voltage may be an upper boundary of the particular zone.

In another exemplary embodiment, there is provided a method that may comprise reading data stored in a non-volatile storage device using a group of soft read reference voltages, decoding the data read from the non-volatile storage device in a soft decoding process, obtaining a number of ones and a number of zeros for each zone of a plurality of zones delineated by the group of soft read reference voltages, determining that the number of ones is equal to the number of zeros in a particular zone of the plurality of zones and setting a voltage value between a first soft read reference voltage and a second soft read reference voltage as an optimal read reference voltage for future read operations. The first soft read reference voltage may be a lower boundary of the particular zone and the second soft read reference voltage may be an upper boundary of the particular zone.

In one embodiment, the voltage value may be a linear function or a non-linear function of the first soft read reference voltage and the second soft read reference voltage.

In one embodiment, the voltage value may be set to be equal to a sum of the first soft read reference voltage multiplied by a and the second soft read reference voltage multiplied by β, in which α and β may be positive numbers.

In one embodiment, the voltage value may be set to be equal to $(Vs1 2+Vs2)0.5/2$, in which $Vs_1$ may be the first soft read reference voltage and $Vs_1$ may be the second soft read reference voltage.

In one embodiment, the method may further comprise de-scrambling the data read from the non-volatile storage device before decoding the data.

In one embodiment, the non-volatile storage device may contain cells that each may be configured to store a multi-bit value, the group of soft read reference voltages may be one of a plurality of groups of soft read reference voltages used in a soft read operation for one logical page, each group of the groups of soft read reference voltages may have a corresponding optimal read reference voltage obtained based on numbers of ones and number of zeros in zones delineated by the plurality of groups of soft read reference voltages.

In one embodiment, the method may further comprise performing one or more additional reads for the logical page using one or more hard decision threshold voltages.

In one embodiment, the method may further comprise determining that a soft read reference voltage of a second group of soft read reference voltages of the plurality of groups of soft read reference voltages is a first boundary of a first zone of a second plurality of zones delineated by the second group of soft read reference voltages in which the number of ones is greater than the number of zeros and a second boundary of a second zone of the second plurality of zones in which the number of ones is less than the number of zeros and setting the soft read reference voltage adjusted by an adjustment as a second optimal read reference voltage associated with the second group of soft read reference voltages. The adjustment may be obtained based on a first comparison result of the number of ones compared to the number of zeros in the first zone and a second comparison result of the number of ones compared to the number of zeros in the second zone.

In yet another exemplary embodiment, there is provided a storage system controller. The storage system controller may comprise a non-volatile storage device, an error correction code (ECC) engine comprising a decoder, and a processor. The processor may be configured to: issue a command to read data stored in the non-volatile storage device using a group of soft read reference voltages, obtain a number of ones and a number of zeros for each zone of a plurality of zones delineated by the group of soft read reference voltages after the decoder decodes the data read from the non-volatile storage device in a soft decoding process, determine whether there is one zone in which the number of ones is equal to the number of zeros, if there is a particular zone that the number of ones is equal to the number of zeros, set a voltage value between a first soft read reference voltage and a second soft read reference voltage as an optimal read reference voltage. The first soft read reference voltage may be a lower boundary of the particular zone and the second soft read reference voltage may be an upper boundary of the particular zone. If there is no zone in which the number of ones is equal to the number of zeros, the processor may be further configured to determine that a soft read reference voltage of the group of soft read reference voltages is an upper boundary of a first zone in which the number of ones is greater than the number of zeros and a lower boundary of a second zone in which the number of ones is less than the number of zeros and set the soft read reference voltage adjusted by an adjustment as the optimal read reference voltage. The adjustment may be obtained based on a first comparison result of the number of ones compared to the number of zeros in the first zone and a second comparison result of the number of ones compared to the number of zeros in the second zone.

In one embodiment, the adjustment may be a linear function or a non-linear function of the first comparison result and the second comparison result, and the first comparison result and the second comparison result may be obtained by either the number of ones minus number of zeros in the first zone and the second zone, respectively, or by a logarithm of a division result of the number of ones divided by the number of zeros in the first zone and the second zone, respectively.

In one embodiment, the processor may be further configured to de-scramble the data read from the non-volatile storage device before decoding the data.

Any of the disclosed methods (e.g., the processes 600, 700 or 800) and operations may be implemented in software comprising computer-executable instructions stored on one or more computer-readable storage media. The one or more computer-readable storage media may include non-transitory computer-readable media (such as removable or non-removable magnetic disks, magnetic tapes or cassettes, solid state drives (SSDs), hybrid hard drives, CD-ROMs, CD-RWs, DVDs, or any other tangible storage medium), volatile memory components (such as DRAM or SRAM), or non-volatile memory components (such as hard drives)). The computer-executable instructions may be executed on a computer (e.g., any commercially available computer, including smart phones or other mobile devices that include computing hardware) by a computer processor (e.g., a CPU, a GPU, or both). Any of the computer-executable instructions for implementing the disclosed techniques as well as any data created and used during implementation of the disclosed embodiments may be stored on one or more computer-readable media (e.g., non-transitory computer-readable media). Such software can be executed, for example, on a single local computing device (e.g., any suitable commercially available computer or mobile device) or in a network environment (e.g., via the Internet, a wide-area network, a local-area network, a client-server network (such as a cloud computing network), or other such network) using one or more network computers.

Embodiments according to the present disclosure, may be implemented for any types of ECC codes, such as, but not limited to, rectangular parity, Turbo, Low-Density Parity-Check (LDPC), Polar, and Hamming code.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
reading data stored in a non-volatile storage device using a group of soft read reference voltages;
decoding the data read from the non-volatile storage device in a soft decoding process;
obtaining a number of ones and a number of zeros for each zone of a plurality of zones delineated by the group of soft read reference voltages;
determining that a soft read reference voltage of the group of soft read reference voltages is a first boundary of a first zone in which the number of ones is greater than the number of zeros and a second boundary of a second zone in which the number of ones is less than the number of zeros; and
setting the soft read reference voltage adjusted by an adjustment as an optimal read reference voltage for future read operations, the adjustment being obtained based on a first comparison result of the number of ones compared to the number of zeros in the first zone and a second comparison result of the number of ones compared to the number of zeros in the second zone.

2. The method of claim 1, wherein the adjustment is a linear function or a non-linear function of the first comparison result and the second comparison result.

3. The method of claim 1, wherein the adjustment is determined by a nested ternary operation as adjustment= $((|OZRI_1|+|OZRI_2|)>THR)?((|OZRI_2|>THR)?OZRI_1*\gamma: OZRI_2*\delta):OZRI_1*\alpha+OZRI_2*\beta$, in which $OZRI_1$ is the first comparison result, $OZRI_2$ is the second comparison result, THR is a threshold value, "*" is a multiplication operator, $\gamma$, $\delta$, $\alpha$ and $\beta$ are positive numbers.

4. The method of claim 3, wherein the first comparison result and the second comparison result are obtained by the number of ones minus number of zeros in the first zone and the second zone, respectively.

5. The method of claim 3, wherein the first comparison result and the second comparison result are obtained by a logarithm of a division result of the number of ones divided by the number of zeros in the first zone and the second zone, respectively.

6. The method of claim 1, further comprising de-scrambling the data read from the non-volatile storage device before decoding the data.

7. The method of claim 1, wherein the non-volatile storage device contains cells that each is configured to store a multi-bit value, the group of soft read reference voltages are one of a plurality of groups of soft read reference voltages used in a soft read operation for one logical page, each group of the groups of soft read reference voltages has a corresponding optimal read reference voltage obtained based on numbers of ones and number of zeros in zones delineated by the plurality of groups of soft read reference voltages.

8. The method of claim 7, further comprising performing one or more additional reads for the logical page using one or more hard decision threshold voltages.

9. The method of claim 7, further comprising:
determining that the number of ones is equal to the number of zeros in a particular zone of a second plurality of zones delineated by a second group of soft read reference voltages of the plurality of groups of soft read reference voltages; and
setting a voltage value between a first soft read reference voltage and a second soft read reference voltage as a second optimal read reference voltage corresponding to the second group of soft read reference voltages for future read operations, wherein the first soft read reference voltage is a lower boundary of the particular zone and the second soft read reference voltage is an upper boundary of the particular zone.

10. A method, comprising:
reading data stored in a non-volatile storage device using a group of soft read reference voltages;
decoding the data read from the non-volatile storage device in a soft decoding process;
obtaining a number of ones and a number of zeros for each zone of a plurality of zones delineated by the group of soft read reference voltages;
determining that the number of ones is equal to the number of zeros in a particular zone of the plurality of zones; and
setting a voltage value between a first soft read reference voltage and a second soft read reference voltage as an optimal read reference voltage for future read operations, wherein the first soft read reference voltage is a lower boundary of the particular zone and the second soft read reference voltage is an upper boundary of the particular zone.

11. The method of claim 10, wherein the voltage value is a linear function or a non-linear function of the first soft read reference voltage and the second soft read reference voltage.

12. The method of claim 10, wherein the voltage value is set to be equal to a sum of the first soft read reference voltage multiplied by α and the second soft read reference voltage multiplied by β, in which α and β are positive numbers.

13. The method of claim 10, wherein the voltage value is set to be equal to $(Vs_1^2+Vs_2)^{0.5}/2$, in which $Vs_1$ is the first soft read reference voltage and $Vs_1$ is the second soft read reference voltage.

14. The method of claim 10, further comprising de-scrambling the data read from the non-volatile storage device before decoding the data.

15. The method of claim 10, wherein the non-volatile storage device contains cells that each is configured to store a multi-bit value, the group of soft read reference voltages are one of a plurality of groups of soft read reference voltages used in a soft read operation for one logical page, each group of the groups of soft read reference voltages has a corresponding optimal read reference voltage obtained based on numbers of ones and number of zeros in zones delineated by the plurality of groups of soft read reference voltages.

16. The method of claim 15, further comprising performing one or more additional reads for the logical page using one or more hard decision threshold voltages.

17. The method of claim 15, further comprising:
determining that a third soft read reference voltage of a second group of soft read reference voltages of the plurality of groups of soft read reference voltages is a first boundary of a first zone of a second plurality of zones delineated by the second group of soft read reference voltages in which the number of ones is greater than the number of zeros and a second boundary of a second zone of the second plurality of zones in which the number of ones is less than the number of zeros; and
setting the third soft read reference voltage adjusted by an adjustment as a second optimal read reference voltage associated with the second group of soft read reference voltages, the adjustment being obtained based on a first comparison result of the number of ones compared to the number of zeros in the first zone and a second comparison result of the number of ones compared to the number of zeros in the second zone.

18. A computer program product comprising a non-transitory computer readable medium having instructions recorded thereon, the instructions when executed by a computer implementing a method comprising:
reading data stored in a non-volatile storage device using a group of soft read reference voltages;
decoding the data read from the non-volatile storage device in a soft decoding process;
obtaining a number of ones and a number of zeros for each zone of a plurality of zones delineated by the group of soft read reference voltages;
determining that a soft read reference voltage of the group of soft read reference voltages is a first boundary of a first zone in which the number of ones is greater than the number of zeros and a second boundary of a second zone in which the number of ones is less than the number of zeros; and
setting the soft read reference voltage adjusted by an adjustment as an optimal read reference voltage for future read operations, the adjustment being obtained based on a first comparison result of the number of ones compared to the number of zeros in the first zone and a second comparison result of the number of ones compared to the number of zeros in the second zone.

19. A computer program product comprising a non-transitory computer readable medium having instructions recorded thereon, the instructions when executed by a computer implementing a method comprising:
reading data stored in a non-volatile storage device using a group of soft read reference voltages;
decoding the data read from the non-volatile storage device in a soft decoding process;
obtaining a number of ones and a number of zeros for each zone of a plurality of zones delineated by the group of soft read reference voltages;
determining that the number of ones is equal to the number of zeros in a particular zone of the plurality of zones; and
setting a voltage value between a first soft read reference voltage and a second soft read reference voltage as an optimal read reference voltage for future read operations, wherein the first soft read reference voltage is a lower boundary of the particular zone and the second soft read reference voltage is an upper boundary of the particular zone.

* * * * *